United States Patent
Lee et al.

(10) Patent No.: US 10,957,412 B2
(45) Date of Patent: Mar. 23, 2021

(54) MEMORY DEVICE AND OPERATING METHOD OF THE MEMORY DEVICE

(71) Applicant: SK hynix Inc., Icheon-si (KR)

(72) Inventors: Hee Youl Lee, Icheon-si (KR); Byung In Lee, Hwaseong-si (KR); Sang Heon Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 73 days.

(21) Appl. No.: 16/197,082

(22) Filed: Nov. 20, 2018

(65) Prior Publication Data

US 2019/0333592 A1 Oct. 31, 2019

(30) Foreign Application Priority Data

Apr. 25, 2018 (KR) .................. 10-2018-0047970

(51) Int. Cl.
| | |
|---|---|
| *G11C 16/06* | (2006.01) |
| *G11C 16/34* | (2006.01) |
| *G11C 16/10* | (2006.01) |
| *G11C 16/30* | (2006.01) |
| *G11C 7/10* | (2006.01) |
| *G11C 16/04* | (2006.01) |
| *H01L 29/788* | (2006.01) |
| *G11C 11/4093* | (2006.01) |
| *G11C 11/56* | (2006.01) |

(52) U.S. Cl.
CPC ........ *G11C 16/3459* (2013.01); *G11C 7/1039* (2013.01); *G11C 11/4093* (2013.01); *G11C 16/0483* (2013.01); *G11C 16/10* (2013.01); *G11C 16/30* (2013.01); *H01L 29/7885* (2013.01); *G11C 11/5628* (2013.01)

(58) Field of Classification Search
CPC . G11C 16/0483; G11C 16/3459; G11C 16/10; G11C 16/26
USPC .................................................. 365/185.22
See application file for complete search history.

(56) References Cited

U.S. PATENT DOCUMENTS

| 9,147,478 B2* | 9/2015 | Park ................... G11C 16/16 |
| 9,922,717 B1* | 3/2018 | Maejima ............. G11C 16/26 |
| 2015/0179266 A1* | 6/2015 | Park ..................... G11C 16/10 |
| | | 365/185.2 |
| 2015/0318298 A1* | 11/2015 | Matsudaira ......... H01L 27/1157 |
| | | 257/314 |

(Continued)

FOREIGN PATENT DOCUMENTS

| KR | 1020140077340 A | 6/2014 |
| KR | 101666942 B1 | 10/2016 |

*Primary Examiner* — Huan Hoang
*Assistant Examiner* — Minh Dinh
(74) *Attorney, Agent, or Firm* — William Park & Associates Ltd.

(57) ABSTRACT

A memory device includes a memory cell array including a plurality of strings, a peripheral circuit coupled to the memory cell array and configured for sequentially performing a program voltage apply operation, a program verify operation, and a hole injection operation on the plurality of strings, and a control logic configured for controlling an operation of the peripheral circuit, wherein the control logic controls the operation of peripheral circuit to generate Gate Induced Drain Leakage (GIDL) at a channel under a select transistor of each of the plurality of strings during the hole injection operation.

26 Claims, 12 Drawing Sheets

(56) References Cited

U.S. PATENT DOCUMENTS

2016/0078947 A1* 3/2016 Yanagida .............. G11C 16/10
365/185.18
2016/0141035 A1* 5/2016 Shim ..................... G11C 16/10
365/185.11

* cited by examiner

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2018-0047970 filed on Apr. 25, 2018, in the Korean Intellectual Property Office, the entire disclosure of which is incorporated herein by reference.

BACKGROUND

1. Technical Field

Various embodiments generally relate to an electronic device, and more particularly, to a memory device and an operating method thereof.

2. Related Art

The recent paradigm as to the computer environment has been transferred to ubiquitous computing which enables use of computer system anytime and anywhere. Thereby, the use of portable electronic devices such as cellular phones, digital cameras, laptop computers, and the like has sharply increased. These portable electronic devices generally use memory systems using memory devices, namely, data storage devices. The data storage devices are used as main memories or auxiliary memories of the portable electronic devices.

The data storage devices using the memory devices do not include mechanical driving units and thus have high stability, durability and information access speed, and consume little electricity. As examples of the memory systems having high stability, durability, and information access speed and consuming little electricity, the data storage devices include Universal Serial Bus (USB) memory devices, memory cards having various interfaces, Solid State Drives (SSDs), and the like.

The memory device is generally classified into a volatile memory device and a nonvolatile memory device.

A nonvolatile memory device may have comparatively low write and read speeds, but may retain data stored therein even when power is turned off. Therefore, the nonvolatile memory device may be used when there is the need for storing data which should be retained regardless of supply of power. Examples of the non-volatile memory devices may include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM), and Ferroelectric RAM (FRAM). Flash memories may be classified into NOR-type memories or NAND-type memories.

SUMMARY

According to an embodiment, a memory device may include a memory cell array including a plurality of strings, a peripheral circuit coupled to the memory cell array and configured for sequentially performing a program voltage apply operation, a program verify operation, and a hole injection operation on the plurality of strings, and a control logic configured for controlling an operation of the peripheral circuit, wherein the control logic controls the operation of the peripheral circuit to generate Gate Induced Drain Leakage (GIDL) at a channel under a source select transistor of each of the plurality of strings during the hole injection operation.

According to an embodiment, a memory device may include a memory cell array including a plurality of strings, a peripheral circuit coupled to the memory cell array and configured for sequentially performing a program voltage apply operation, a program verify operation, and a hole injection operation, and a control logic configured for controlling an operation of the peripheral circuit, wherein the control logic controls the operation of the peripheral circuit to generate Gate Induced Drain Leakage (GIDL) at a channel under a drain select transistor of each of unselected strings in a program inhibit mode from among the plurality of strings during the hole injection operation.

According to an embodiment, a method of performing a program operation of a memory device including a plurality of strings may include applying a program voltage to a selected word line among word lines of the plurality of strings, performing a program verify operation, performing a hole injection operation so as to generate Gate Induced Drain Leakage (GIDL) at a channel under a source select transistor of each of the plurality of strings when a result of the program verify operation is determined as failed, and reperforming the program operation from the applying of the program voltage by increasing the program voltage.

According to another embodiment, a method of performing a program operation of a memory device including a plurality of strings may include applying a program voltage to a selected word line among word lines of the plurality of strings, performing a program verify operation, performing a hole injection operation so as to generate Gate Induced Drain Leakage (GIDL) at a channel under a drain select transistor of each of unselected strings in a program inhibit mode among the plurality of strings when a result of the program verify operation is determined as failed, and reperforming the program operation from the applying of the program voltage by increasing the program voltage.

According to an embodiment, a memory device may include a memory cell array including a plurality of strings. The memory device may include a peripheral circuit coupled to the memory cell array and configured to perform a program operation on a selected string from the plurality of strings and a hole injection operation on an unselected string from the plurality of strings. The peripheral circuit may apply a positive voltage to the unselected string in a program inhibit mode and to a bit line of the unselected string during the hole injection operation. The peripheral circuit may apply a turn-off voltage to a drain select line coupled to the drain select transistor of each of the plurality of strings.

DETAILED DESCRIPTION

Various embodiments may be directed to a memory device capable of improving electrical characteristics by increasing a channel potential level of an unselected string during a program operation, and an operating method thereof.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

Various embodiments of the present disclosure may be directed to a memory device, a memory system having the memory device, and a method of operating the memory device, which can determine the result of a final status check using the number of program pulses used in a program operation of the memory device.

Figure 1:
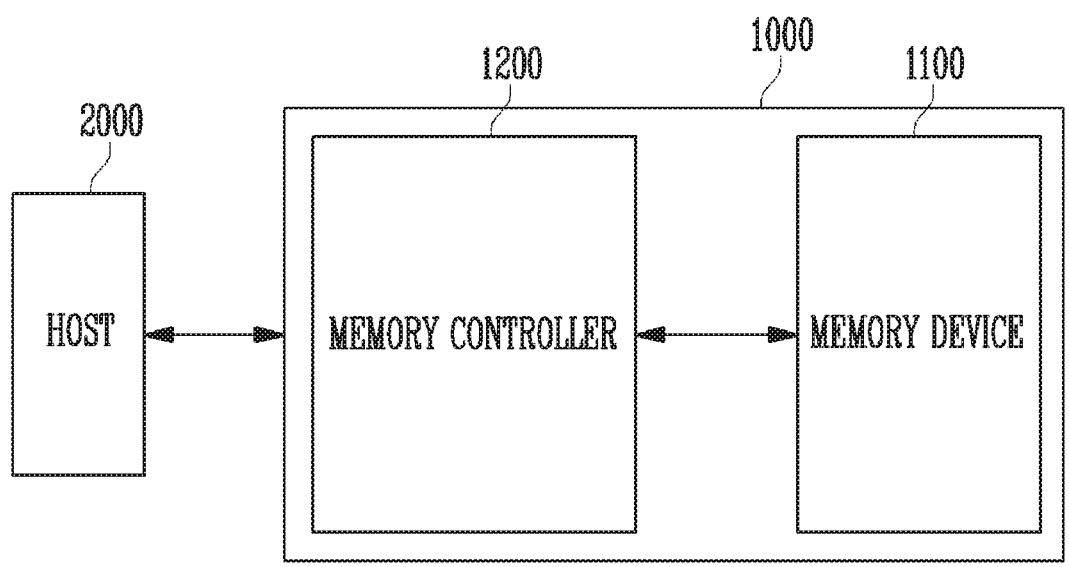
FIG. 1 is a diagram illustrating a memory system according to an embodiment.

FIG. 1 is a diagram illustrating a memory system 1000 according to an embodiment.

Referring to FIG. 1, the memory system 1000 may include a memory device 1100 storing data and a memory controller 1200 controlling the memory device 1100 in response to control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or serial attached SCSI (SAS). In addition, the interface protocol provided for the purpose of data communication between the host 2000 and the memory system 1000 is not limited to the above examples and may be an interface protocol such as a Universal Serial Bus (USB), a Multi-Media Card (MMC), an Enhanced Small Disk Interface (ESDI), or Integrated Drive Electronics (IDE).

The memory controller 1200 may control the general operations of the memory system 1000 and control a data exchange between the host 2000 and the memory device 1100. For example, the memory controller 1200 may control the memory device 1100 to program or read data in response to a request from the host 2000. In addition, the memory controller 1200 may store information about main memory blocks and sub-memory blocks included in the memory device 1100, and select the memory device 1100 to perform a program operation on a main memory block or a sub-memory block according to the amount of data loaded for the program operation. According to an embodiment, the memory device 1100 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM) or flash memory.

The memory controller 1200 may control the memory device 1100 to perform a program, read, or erase operation.

Figure 2:
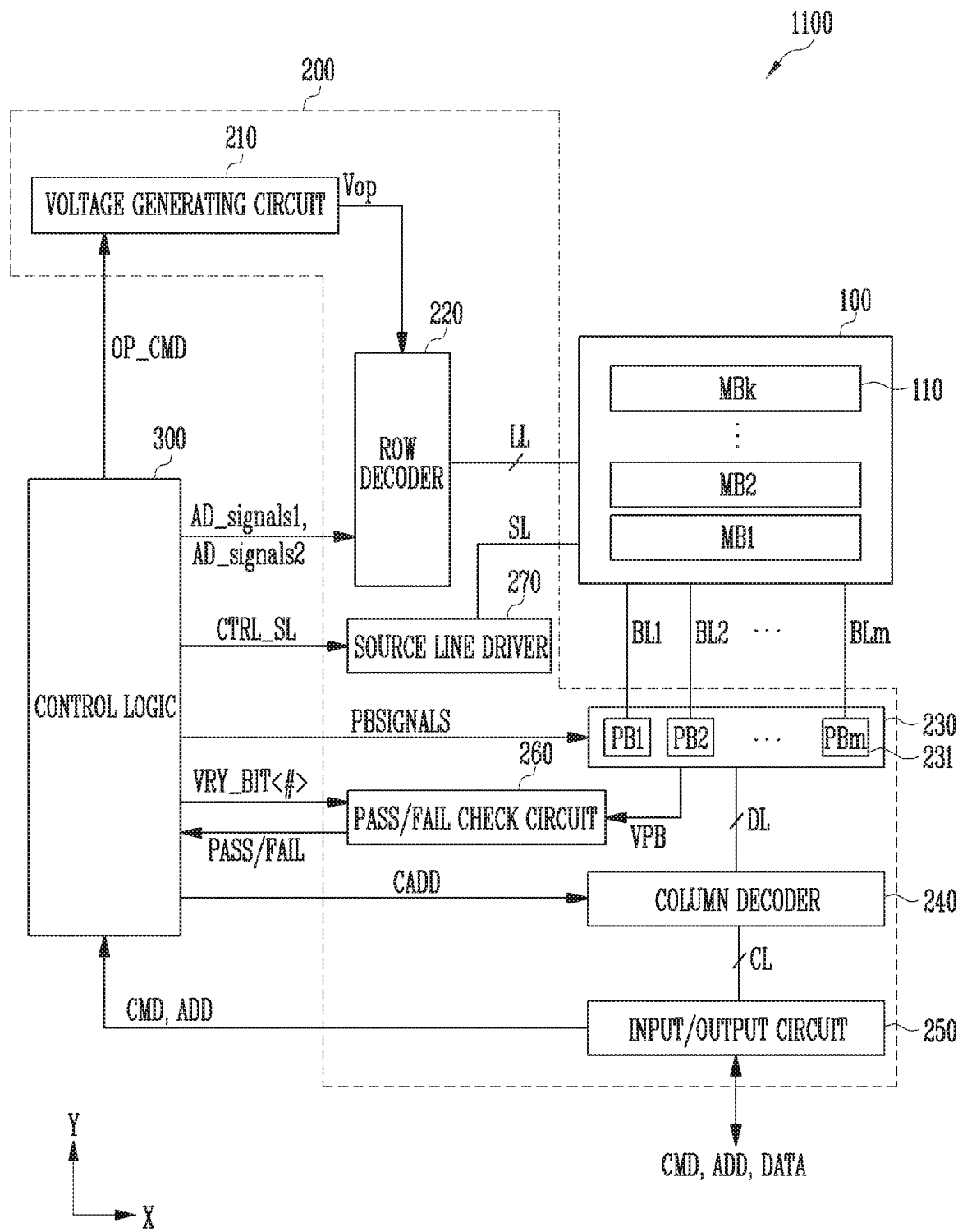
FIG. 2 is a diagram illustrating a memory device shown in FIG.

FIG. 2 is a diagram illustrating the memory device 1100 shown in FIG.

Referring to FIG. 2, the memory device 1100 may include a memory cell array 100 storing data. The memory device 1100 may include peripheral circuits 200 configured to perform a program operation to store data in the memory cell array 100, a read operation to output the stored data, and an erase operation to erase the stored data. The memory device 1100 may include a control logic 300 which controls the peripheral circuits 200 in response to control of the memory controller 1200 shown in FIG. 1.

The memory cell array 100 may include a plurality of memory blocks (MB1 to MBk) 110, where k is a positive integer. Local lines LL and bit lines BL1 to BLm may be coupled to each of the memory blocks (MB1 to MBk) 110, where m is a positive integer. For example, the local lines LL may include a first select line, a second select line, and a plurality of word lines arranged between the first and second select lines. In addition, the local lines LL may include dummy lines arranged between the first select line and the word lines, and between the second select line and the word lines. In this example, the first select line may be a source select line and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks (MB1 to MBk) 110, respectively, and the bit lines BL1 to BLm may be commonly coupled to the memory blocks (MB1 to MBk) 110. The memory blocks (MB1 to MBk) 110 may have a two-dimensional or three-dimensional structure. For example, in the 2D memory blocks 110, memory cells may be arranged in parallel with a substrate. For example, in the 3D memory blocks 110, memory cells may be stacked in a vertical direction to the substrate.

The peripheral circuits 200 may be configured to perform program, read and erase operations on the selected memory block 110 in response to control of the control logic 300. For example, the peripheral circuits 200 may include a voltage generating circuit 210, a row decoder 220, a page buffer group 230, a column decoder 240, an input/output circuit; 250, a pass/fail check circuit 260, and a source line driver 270.

The voltage generating circuit 210 may generate various operating voltages Vop used to perform program, read and erase operations in response to an operation signal OP_CMD. In addition, the voltage generating circuit 210 may selectively discharge the local lines LL in response to the operation signal OP_CMD. For example, the voltage generating circuit 210 may generate a program voltage, a verify voltage, a pass voltage, a turn-on voltage, and a turn-off voltage in response to control of the control logic 300.

The row decoder 220 may transfer the operating voltages Vop to the local lines LL coupled to the selected memory block 110 in response to row decoder control signals AD_signals1 and AD_signals2. For example, the row decoder 220 may selectively apply operating voltages (for example, a program voltage, a verify voltage, a pass voltage, etc.) generated from the voltage generating circuit 210 to word lines among the local lines LL in response to the row decoder control signals AD_signals1. In another example, the row decoder 220 may selectively apply operating voltages (for example, a turn-on voltage and a turn-off voltage) generated from the voltage generating circuit 210 to a source select line and a drain select line among the local lines LL in response to the row decoder control signals AD_signals2. The row decoder 220 may apply the turn-off voltage to the drain select line or the source select line, or to the drain select line and the source select line in response to the row decoder control signals AD_signals2 to generate Gate Induced Drain Leakage (GIDL) at a channel under a drain select transistor or a channel under a source select transistor during a hole injection operation which is performed after the program verify operation and before a next program voltage apply operation.

The row decoder 220 may apply the program voltage generated from the voltage generating circuit 210 in response to the row decoder control signals AD_signals1 to a selected word line among the local lines LL during a program voltage apply operation. The row decoder 220 may apply the pass voltage generated from the voltage generating circuit 210 to unselected word lines, namely, the rest of the word lines which are not selected. In addition, the row decoder 220 may apply a verify voltage generated from the voltage generating circuit 210 in response to the row decoder control signals AD_signals1 to the selected word line among the local lines LL during the program verify operation and may apply the pass voltage generated from the voltage generating circuit 210 to the unselected word lines, namely, the rest of the word lines which are not selected.

The page buffer group 230 may include a plurality of page buffers (PB1 to PBm) 231 coupled to the bit lines BL1 to BLm. The page buffers (PB1 to PBm) 231 may operate in response to page buffer control signals PBSIGNALS. For example, the page buffers (PB1 to PBm) 231 may temporarily store data received through the bit lines BL1 to BLm, or may sense voltages or currents of the bit lines BL1 to BLm during a read or verify operation. In addition, the page buffers (PB1 to PBm) 231 may apply a positive voltage to at least one of bit line BL1 to BLm in a program inhibit mode during the hole injection operation which is performed after the program verify operation and before the next program voltage apply operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer a command CMD and an address ADD from the memory controller 1200 shown in FIG. 1 to the control logic 300, or may exchange data DATA with the column decoder 240.

The pass/fail check circuit 260 may generate a reference current in response to an allowable bit VRY_BIT<#> during a read operation or a verify operation, and may output a pass signal PASS or a fail signal FAIL by comparing a sensing voltage VPB received from the page buffer group 230 with a reference voltage generated by the reference current.

The source line driver 270 may be coupled to the memory cell included in the memory cell array 100 through the source line SL and may control a voltage applied to the source line SL. For example, the source line driver 270 may apply a positive source line voltage to the source line SL during the hole injection operation after the program verify operation. The source line driver 270 may receive a source line control signal CTRL_SL from the control logic 300 and may control a source line voltage applied to the source line SL based on the source line control signal CTRL_SL.

The control logic 300 may output the operation signal OP_CMD, the row decoder control signals AD_signals1 and AD_signals2, the page buffer control signals PBSIGNALS and the allowable bit VRY_BIT<#> in response to the command CMD and the address ADD to control the peripheral circuits 200. In addition, the control logic 300 may determine whether a verify operation passes or fails in response to the pass or fail signal PASS or FAIL.

The memory device 1100 according to the above-described embodiment may perform the hole injection operation after the program verify operation and before the program voltage apply operation to increase a channel potential level of an unselected string in the program inhibit mode among a plurality of strings included in the memory block. The hole injection operation will be described below.

Figure 3:
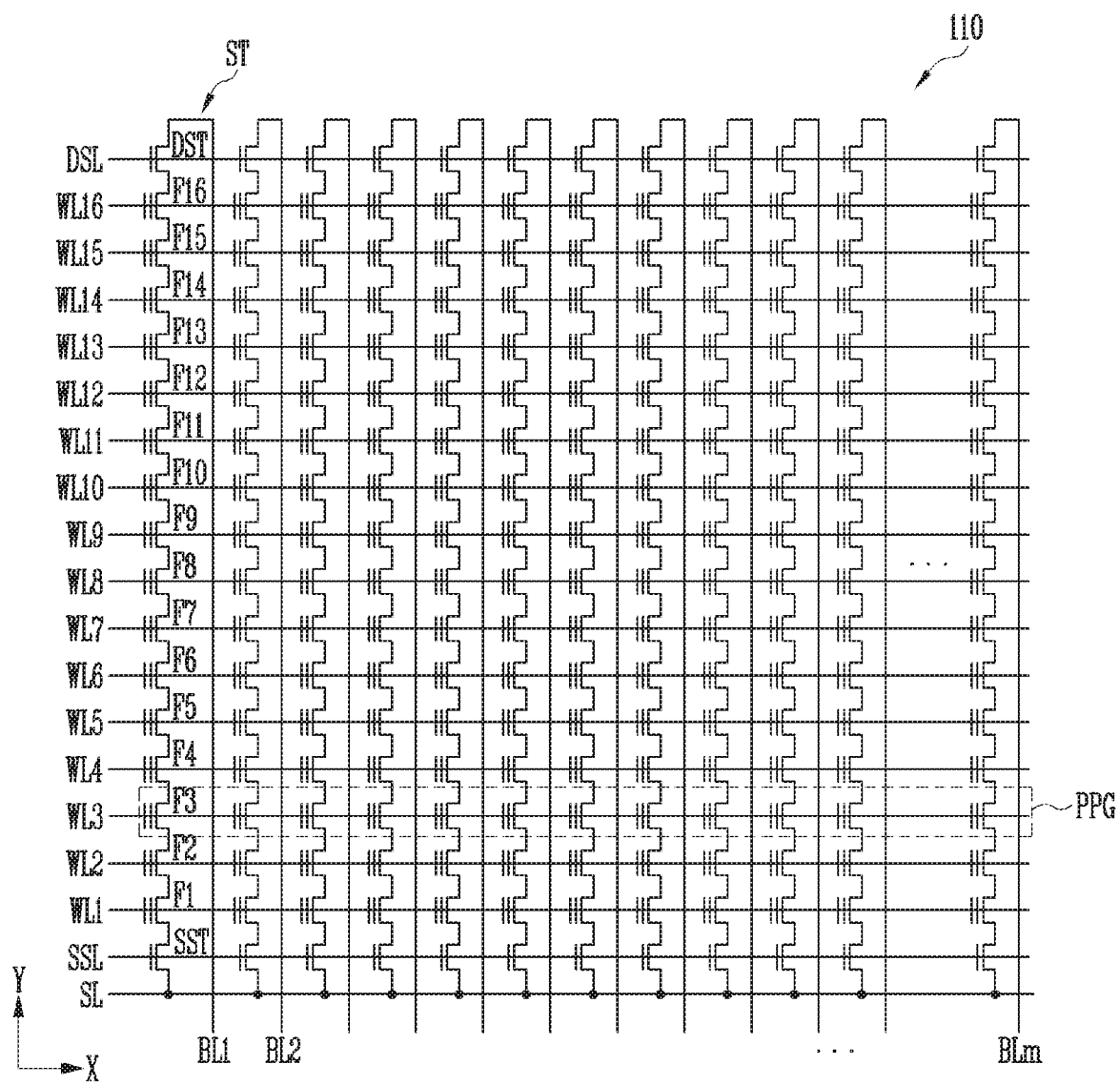
FIG. 3 is a diagram illustrating a memory block shown in FIG. 2.

FIG. 3 is a diagram illustrating the memory block 110 shown in FIG. 2.

Referring to FIG. 3, the memory block 110 may be configured such that the plurality of word lines which are arranged in parallel may be coupled between the first select line and the second select line. The first select line may be a source select line SSL and the second select line may be a drain select line DSL. For example, the memory block 110 may include a plurality of strings ST coupled between the bit lines BL1 to BLm and the source line SL. Each of the bit lines BL1 to BLm may be coupled to each of the strings ST, and the source line SL may be commonly coupled to the strings ST. Since the strings ST may have the same configuration, the string ST coupled to the first bit line BL1 will be described as an example.

The string ST may include a source select transistor SST, a plurality of memory cells F1 to F16, and a drain select transistor DST which are coupled in series between the source line SL and the first bit line BL1. The single string ST may include at least one source select transistor SST and at least one drain select transistors DST, and may include more memory cells than the memory cells F1 to F16 as shown in FIG. 3.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in the different strings ST may be coupled to the source select line SSL, gates of the drain select transistors DST may be coupled to the drain select line DSL, and gates of the memory cells F1 to F16 may be coupled to a plurality of word lines WL1 to WL16. A group of memory cells coupled to the same word line, among memory cells included in the different strings ST, may be referred to as a physical page PPG. Therefore, the memory block 110 may include as many physical pages PPG as the number of word lines WL1 to WL16.

A single memory cell may store one bit of data. This memory cell is generally called a single level cell (SLC). A single physical page PPG may store data corresponding to a single logical page LPG. Data corresponding to the single logical page LPG may include as many data bits as the number of cells included in the single physical page PPG. In addition, a single memory cell may store two or more bits of data. This cell is typically referred to as a multi-level cell (MLC). The single physical page PPG may store data corresponding to two or more logical pages LPG.

Figure 4:
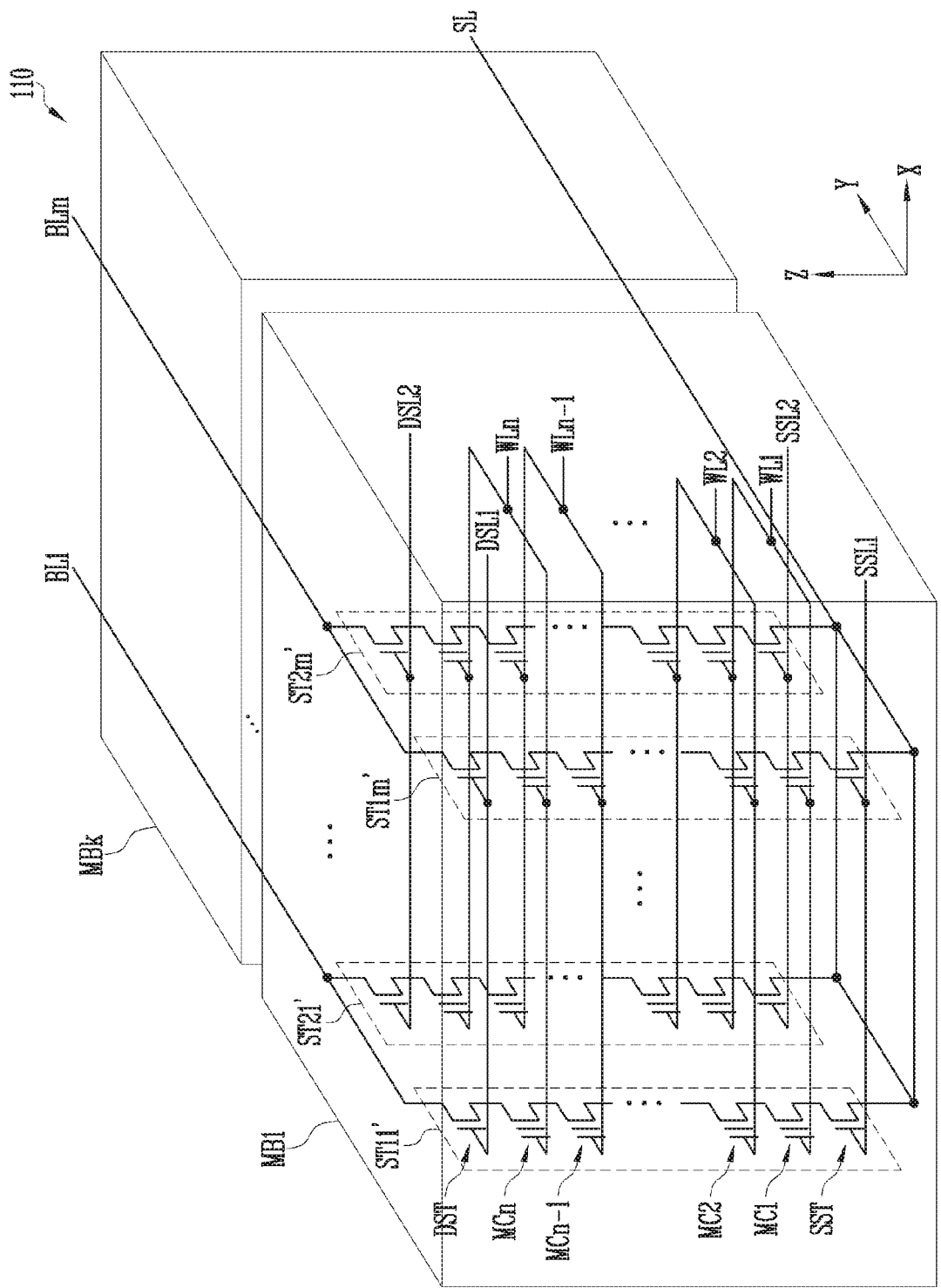
FIG. 4 is a diagram illustrating an embodiment of a memory block having a three-dimensional structure.

Referring to FIG. 4, the memory cell array 100 may include the plurality of memory blocks (MB1 to MBk) 110. The memory block 110 may include a plurality of strings ST11' to ST1m' and ST21' to ST2m'. Each of the plurality of strings ST11' to ST1m' and ST21' to ST2m' may extend in a vertical direction (Z direction). In the memory block 110, m strings may be arranged in a row direction (X direction). Although two strings are arranged in a column direction (Y direction) as shown in FIG. 4, it is for convenience of explanation, and three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. Source select transistors of the strings ST11' to ST1m' arranged in a first row may be coupled to a first source select line SSL1. Source select transistors of the strings ST21' to ST2m' arranged in a second row may be coupled to a second source select line SSL2. According to another embodiment, the source select transistors of the strings ST11' to ST1m' and ST21' to ST2m' may be commonly coupled to a single source select line.

The first to nth memory cells MC1 to MCn of each string may be coupled in series between the source select transistor SST and the drain select transistor DST. Gates of the first to nth memory cells MC1 to MCn may be coupled to first to nth word lines WL1 to WLn, respectively.

According to an embodiment, at least one of the first to nth memory cells MC1 to MCn may serve as a dummy memory cell. When a dummy memory cell is provided, a voltage or a current of the corresponding string may be stably controlled. As a result, the reliability of data stored in the memory block 110 may be improved.

The drain select transistor DST of each string may be coupled between the bit line and the memory cells MC1 to MCn. The drain select transistors DST of strings arranged in the row direction may be coupled to a drain select line extending in the row direction. The drain select transistors DST of strings CS11' to CS1m' in a first row may be coupled to a first drain select line DSL1. The drain select transistors DST of strings CS21' to CS2m' in a second row may be coupled to a second drain select line DSL2.

Figure 5:
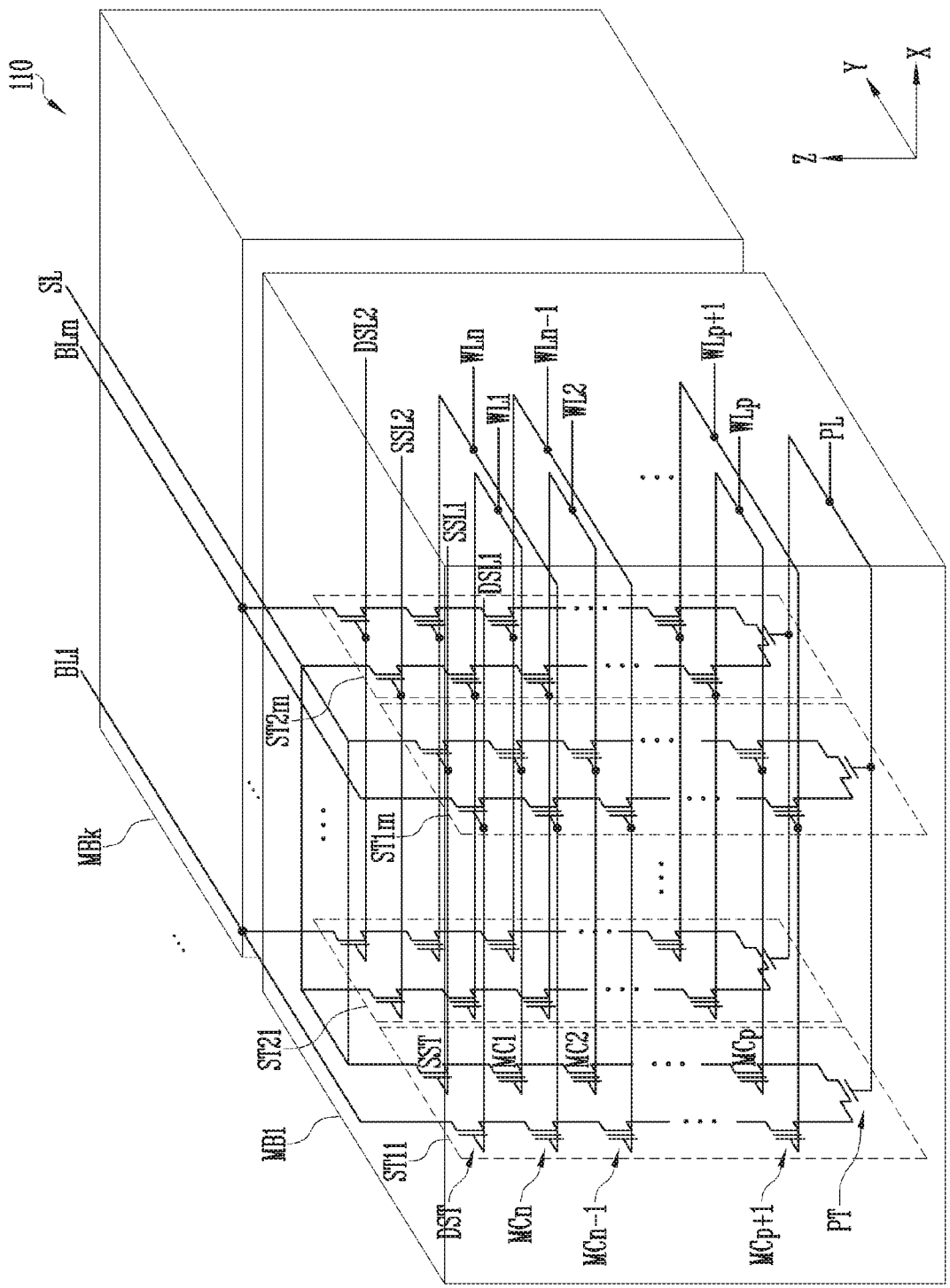
FIG. 5 is a diagram illustrating another embodiment of a memory block having a three-dimensional structure.

FIG. 5 is a diagram illustrating an embodiment of the memory block 110 having a three-dimensional structure.

Referring to FIG. 5, the memory cell array 100 may include the plurality of memory blocks (MB1 to MBk) 110. The memory block 110 may include a plurality of strings ST11 to ST1m and ST21 to ST2m. According to an embodiment, each of the plurality of strings ST11 to ST1m and ST21 to ST2m may have a 'U' shape. In the first memory block MB1, m strings may be arranged in the row direction (X direction). Although two strings are arranged in the column direction (Y direction) as shown in FIG. 5, it is for convenience of explanation, and three or more strings may be arranged in the column direction (Y direction).

Each of the plurality of strings ST11 to ST1m and ST21 to ST2m may include at least one source select transistor SST, the first to nth memory cells MC1 to MCn, a pipe transistor PT and at least one drain select transistor DST.

The source and drain select transistors SST and DST and the memory cells MC1 to MCn may have similar structures to each other. For example, each of the source and drain select transistors SST and DST and the memory cells MC1 to MCn may include a channel layer, a tunnel insulating layer, a charge trap layer and a blocking insulating layer. For example, a pillar for providing a channel layer may be provided in each string. For example, a pillar for providing at least one of a channel layer, a tunnel insulating layer, a charge trap layer and a blocking insulating layer may be provided in each string.

The source select transistor SST of each string may be coupled between the source line SL and memory cells MC1 to MCp.

According to an embodiment, source select transistors of the strings arranged in the same row may be coupled to the source select line extending in the row direction, and source select transistors of the strings arranged in different rows may be coupled to different source select lines. As shown in FIG. 5, source select transistors of the strings ST11 to ST1m in the first row may be coupled to the first source select line SSL1. Source select transistors of the strings ST21 to ST2m in the second row may be coupled to the second source select line SSL2.

According to another embodiment, the source select transistors of the strings ST11 to ST1m and ST21 to ST2m may be commonly coupled to a single source select line.

The first to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in the vertical direction (Z direction) and be coupled in series between the source select transistor SST and the pipe transistor PT. The (p+1)th to nth memory cells MCp+1 to MCn may be sequentially arranged in the vertical direction (Z direction) and be coupled in series between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to the first to nth word lines WL1 to WLn, respectively.

According to an embodiment, at least one of the first to nth memory cells MC1 to MCn may serve as a dummy memory cell. When a dummy memory cell is provided, a voltage or a current of the corresponding string may be stably controlled. A gate of the pipe transistor PT of each string may be coupled to a pipe line PL.

The drain select transistor DST of each string may be coupled between the bit line and the memory cells MCp+1 to MCn. Strings arranged in the row direction may be coupled to a drain select line extending in the row direction. Drain select transistors of the strings ST11 to ST1*m* in the first row may be coupled to the first drain select line DSL1. Drain select transistors of the strings ST21 to ST2*m* in the second row may be coupled to the second drain select line DSL2.

Strings arranged in the column direction may be coupled to bit lines extending in the column direction. As shown in FIG. 4, the strings ST11 and ST21 in the first column may be coupled to the first bit line BL1. The strings ST1*m* and ST2*m* in the mth column may be coupled to the mth bit line BL*m*.

Memory cells coupled to the same word line, among the strings arranged in the row direction, may form a single page. For example, memory cells coupled to the first word line WL1 of the strings ST11 to ST1*m* in the first row may form a single page. Memory cells coupled to the first word line WL1 of the strings ST21 to ST2*m* in the second row may form another single page. When one of the drain select lines DSL1 and DSL2 is selected, strings arranged in one row direction may be selected. One page of selected strings may be selected when one of the word lines WL1 to WLn is selected.

In other words, the memory block 110 shown in FIG. 5 may have a similar equivalent circuit to the memory block 110 shown in FIG. 4 except that the pipe transistor PT is included in each string.

Figure 6:
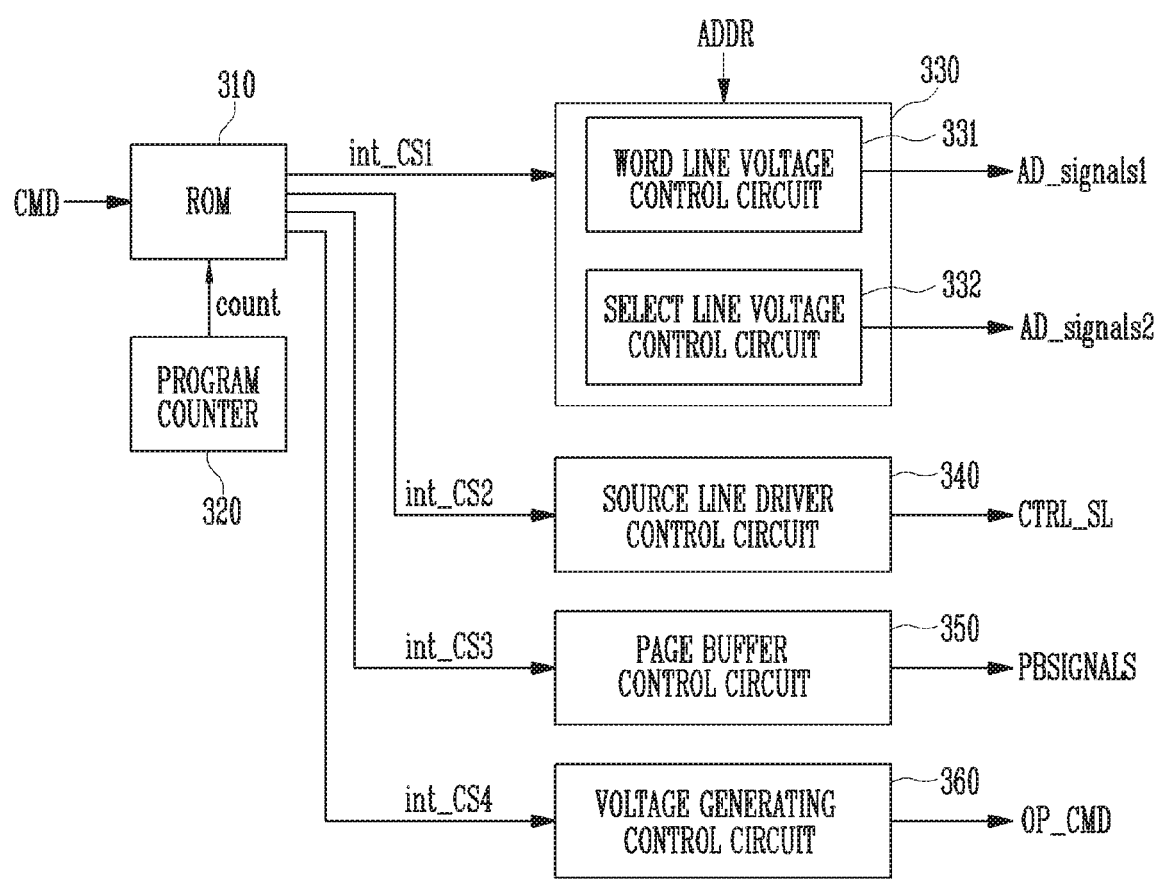
FIG. 6 is a block diagram illustrating a control logic shown in FIG. 2.

FIG. 6 is a block diagram illustrating the control logic 300 shown in FIG. 2.

Referring to FIG. 6, the control logic 300 may include ROM 310, a program counter 320, a row decoder control circuit 330, a source line driver control circuit 340, a page buffer control circuit 350, and a voltage generating control circuit 360.

The ROM 310 may store an algorithm for performing various general operations (a program operation, a read operation, an erase operation, etc.) of the memory device. The ROM 310 may output a plurality of internal control signals int_CS1, int_CS2, int_CS3, and int_CS4 in response to the command CMD and a counting signal count.

The program counter 320 may generate and output the counting signal count that is counted during a predetermined period during the general operations of the memory device.

The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The row decoder control circuit 330 may generate and output the row decoder control signals AD_signals1 and AD_signals2 for controlling the row decoder 220 of FIG. 2 in response to the internal control signal int_CS1 output from the ROM 310.

The row decoder control circuit 330 may include a word line voltage control circuit 331 and a select line voltage control circuit 332.

The word line voltage control circuit 331 may generate and output the row decoder control signals AD_signals1 in response to the internal control signal int_CS1. The row decoder control signals AD_signals1 may control the row decoder 220 of FIG. 2 to selectively apply the operating voltages (for example, the program voltage, the verify voltage, the pass voltage, etc.) generated from the voltage generating circuit 210 of FIG. 2 to the word lines among the local lines LL.

The select line voltage control circuit 332 may generate and output the row decoder control signals AD_signals2 in response to the internal control signal int_CS1. The row decoder control signals AD_signals2 may control the row decoder 220 of FIG. 2 to selectively apply the operating voltages (for example, the turn-on voltage and the turn-off voltage) generated from the voltage generating circuit 210 of FIG. 2 to the source select line and the drain select line among the local lines LL.

The source line driver control circuit 340 may generate and output the source line control signal CTRL_SL for controlling the source line driver 270 of FIG. 2 in response to the internal control signal int_CS2 output from the ROM 310. The source line control signal CTRL_SL may control the source line driver 270 of FIG. 2 to apply the source line voltage to the source line of the memory cell array 100.

The page buffer control circuit 350 may generate and output the page buffer control signals PBSIGNALS for controlling the page buffer group 230 of FIG. 2 in response to the internal control signal int_CS3 output from the ROM 310.

The voltage generating control circuit 360 may generate and output the operation signal OP_CMD for controlling the voltage generating circuit 210 of FIG. 2 in response to the internal control signal int_CS4 output from the ROM 310.

Figure 7:
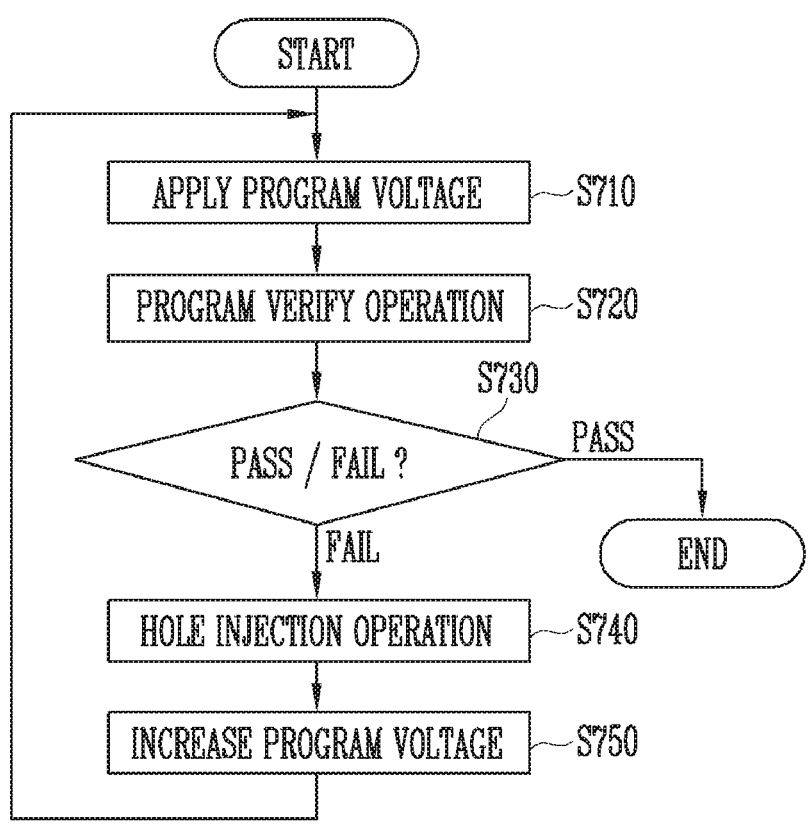
FIG. 7 is a flowchart illustrating a program operation of a memory device according to an embodiment.

FIG. 7 is a flowchart illustrating a program operation of a memory device according to an embodiment.

The program operation of the memory device according to an embodiment may be described with reference to FIGS. 1 to 7 as below.

When the program operation is requested from the host 2000, the memory controller 1200 may output the command CMD, the address ADD and the data DATA corresponding to the program operation to the memory device 1100.

The control logic 300 may generate and output the operation signal OP_CMD, the row decoder control signals AD_signals1 and AD_signals2, and the page buffer control signals PBSIGNALS for controlling the peripheral circuits 200 to perform the program operation in response to the command CMD and the address ADD.

The peripheral circuits 200 may perform a program voltage apply operation in response to control of the control logic 300 (S710). The page buffer group 230 may receive and temporarily store the data DATA in response to the page buffer control signals PBSIGNALS and may apply a program allow voltage (for example, a ground voltage) or a program inhibit voltage (for example, a power supply voltage) to the bit lines BL1 to BLm according to the temporarily stored data DATA. The voltage generating circuit 210 may generate various operating voltages Vop used to perform program, read and erase operations in response to the operation signal OP_CMD. The voltage generating circuit 210 may generate a program voltage and a pass voltage in response to the operation signal OP_CMD. The row decoder 220 may apply the program voltage to the selected word line among the word lines WL1 to WL16 and the pass voltage to the remaining word lines in response to the row decoder control signals AD_signals1.

Thereafter, the peripheral circuits 200 may perform a program verify operation according to control of the control logic 300 (S720). The voltage generating circuit 210 may generate verify and pass voltages in response to the operation signal OP_CMD. The row decoder 220 may apply the verify voltage to the selected word line among the word lines WL1 to WL16 and the pass voltage to the remaining word lines in response to the row decoder control signals AD_signals1. The page buffer group 230 may sense a potential level or the amount of current of the bit lines BL1 to BLm in response to the page buffer control signals PBSIGNALS and may verify whether the programs of the memory cells are completed by comparing a sensing result with the temporarily stored data DATA.

Whether the program operation passes or fails may be determined according to a result of the above-described program verify operation (S730). For example, when all memory cells are completely programmed, the program operation may be determined as passed and may end. For example, when at least one memory cell is not programmed, the program operation may be determined as failed and a next operation may be performed.

When the program operation is determined as failed according to the result of the program verify operation, the peripheral circuits 200 may perform the hole injection operation in response to control of the control logic 300 (S740).

The peripheral circuits 200 may increase a channel potential of a string in a program inhibit mode among a plurality of strings included in the selected memory block among the plurality of memory blocks MB1 to MBk included in the memory cell array 100 during the hole injection operation. The string in the program inhibit mode may include the memory cell which is determined as passed according to the result of the program verify operation. The program inhibit voltage may be applied to the string in the program inhibit mode according to the data to be programmed.

After the above-described program verify operation is performed, the verify voltage and the pass voltage applied to the word lines may be discharged. When the word lines are discharged, a cut off phenomenon may occur to a channel of each of the strings by program cells included in the strings. Accordingly, the channel of each of the strings may be partially isolated, and a negative boosting phenomenon may occur when the word lines are discharged, so that the channel potential of the string may decrease than a target level. The hole injection operation may generate GIDL at the channel under the drain select transistor or at the channel under the source select transistor included in the string in the program inhibit mode to increase the channel potential of the string in the program inhibit mode. Accordingly, the hole injection operation may compensate for the channel potential level of the string in the program inhibit mode which is decreased by the negative boosting phenomenon when the word lines are discharged. Thereby, a program disturb phenomenon of the string in the program inhibit mode may be improved.

Thereafter, the control logic 300 may increase and newly set the program voltage (S750). Thereafter, the program operation may be reperformed from the program voltage apply operation (S710) by using the newly set program voltage.

Figure 8:
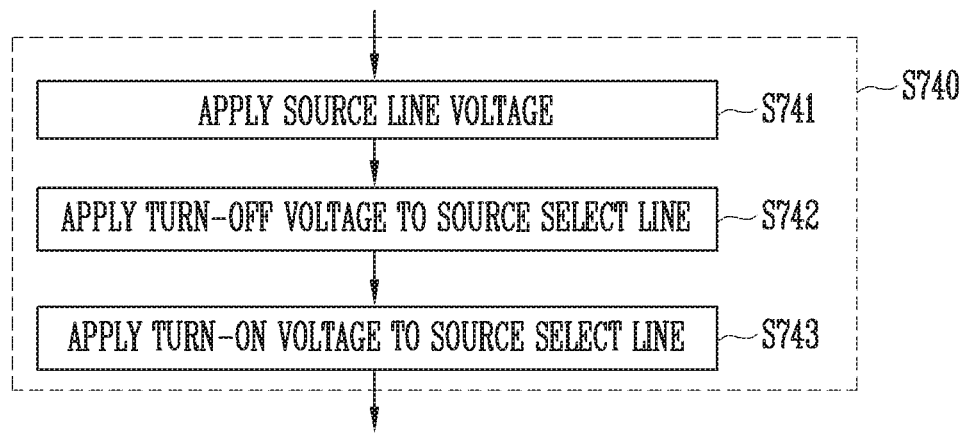
FIG. 8 is a flowchart illustrating a first embodiment of a hole injection operation shown in FIG. 7.

FIG. 8 is a flowchart illustrating a first embodiment of the hole injection operation (S740) shown in FIG. 7.

Referring to FIGS. 2, 3, and 8, during the hole injection operation (S740), the source line driver 270 may apply a source line voltage having a positive potential to the source line SL (S741). Thereafter, the voltage generating circuit 210 may generate and output a turn-off voltage and the row decoder 220 may apply the turn-off voltage to the source select line SSL (S742). Thereby, GIDL may be generated at the channel under the source select transistor SST and may flow towards a direction of the channel. In other words, a hot hole may be generated in a drain region of the source select transistor SST and may flow in towards the direction of the channel to increase the channel potential.

Thereafter, the voltage generating circuit 210 may generate and output a turn-on voltage and the row decoder 220 may apply the turn-on voltage to the source select line SSL (S743). Thereby, the channel potential of each of the strings may be precharged by the source line voltage.

Although an embodiment of the present disclosure in which the voltage generating circuit 210 generates the turn-off voltage and the row decoder 220 applies the turn-off voltage to the source select line SSL at step S742 is described, the same effect may be obtained when the row decoder 220 couples the source select line SSL to a ground power terminal to apply the turn-off voltage.

Figure 9:
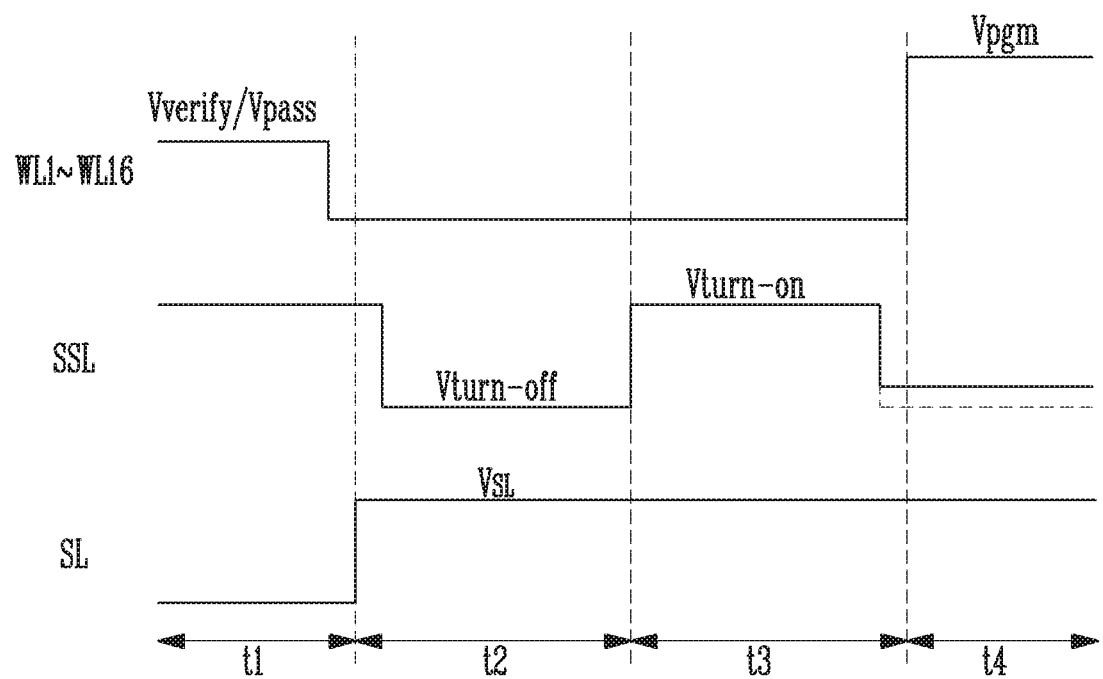
FIG. 9 is a waveform diagram of signals for illustrating a program operation of a memory device according to a first embodiment.

FIG. 9 is a waveform diagram of signals for illustrating a program operation of a memory device according to a first embodiment.

Referring to FIG. 9, a verify voltage Vverify and a pass voltage Vpass may be applied to the word lines WL1 to WL16 during a program verify operation (t1). After a predetermined time, the verify voltage Vverify and the pass voltage Vpass which are applied to the word lines WL1 to WL16 may be discharged. Thereafter, a positive source line voltage $V_{SL}$ may be applied to the source line SL during a hole injection operation (t2) and a turn-off voltage Vturn-off may be applied to the source select line SSL to generate GIDL at the channel under the source select transistor. Thereafter, during a channel precharge operation (t3), a turn-on voltage Vturn-on may be applied to the source select line SSL to precharge the channel of the string. Since the channel of the string is precharged by the hole injection operation (t2), the channel precharge operation (t3) may be skipped. Thereafter, during a program voltage apply operation (t4), the voltage applied to the source select line SSL may be discharged to a ground voltage or a predetermined voltage level and a program voltage Vpgm and the pass voltage Vpass may be applied to the word lines WL1 to WL16.

Figure 10:
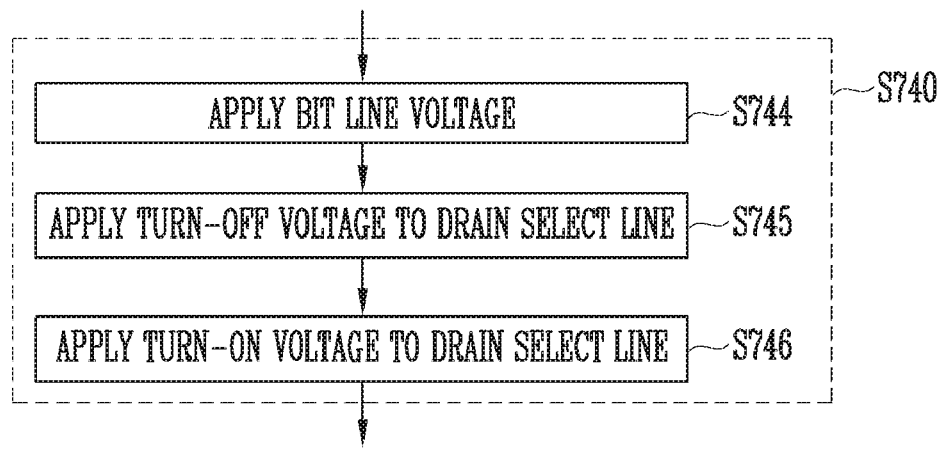
FIG. 10 is a flowchart illustrating a second embodiment of a hole injection operation shown in FIG. 7.

FIG. 10 is a flowchart illustrating a second embodiment of the hole injection operation (S740) shown in FIG. 7.

Referring to FIGS. 2, and 10, during the hole injection operation (S740), the page buffer group 230 may apply a positive voltage to unselected bit lines coupled to the string in the program inhibit mode among the plurality of the bit lines BL1 to BLm (S744). The positive voltage may be a program inhibit voltage. A program allow voltage may be applied to selected bit lines coupled to the string to perform a program operation. Thereafter, the voltage generating circuit 210 may generate and output a turn-off voltage, and the row decoder 220 may apply the turn-off voltage to the drain select line DSL (S745). Thereby, GIDL may be generated at the channel under the drain select transistor DST and may flow towards a direction of the channel. In other words, a hot hole may be generated in a source region of the drain select transistor DST and may flow in towards the direction of the channel to increase the channel potential.

Thereafter, the voltage generating circuit 210 may generate and output a turn-on voltage, and the row decoder 220 may apply the turn-on voltage to the drain select line DSL (S746). Thereby, the channel potential of each of the strings in the program inhibit mode may be precharged by the bit line voltage.

Although an embodiment in which the voltage generating circuit 210 generates the turn-off voltage and the row decoder 220 applies the turn-off voltage to the drain select line DSL at step S745 is described, the same effect may be obtained when the row decoder 220 couples the drain select line DSL to a ground power terminal to apply a turn-off voltage.

Figure 11:
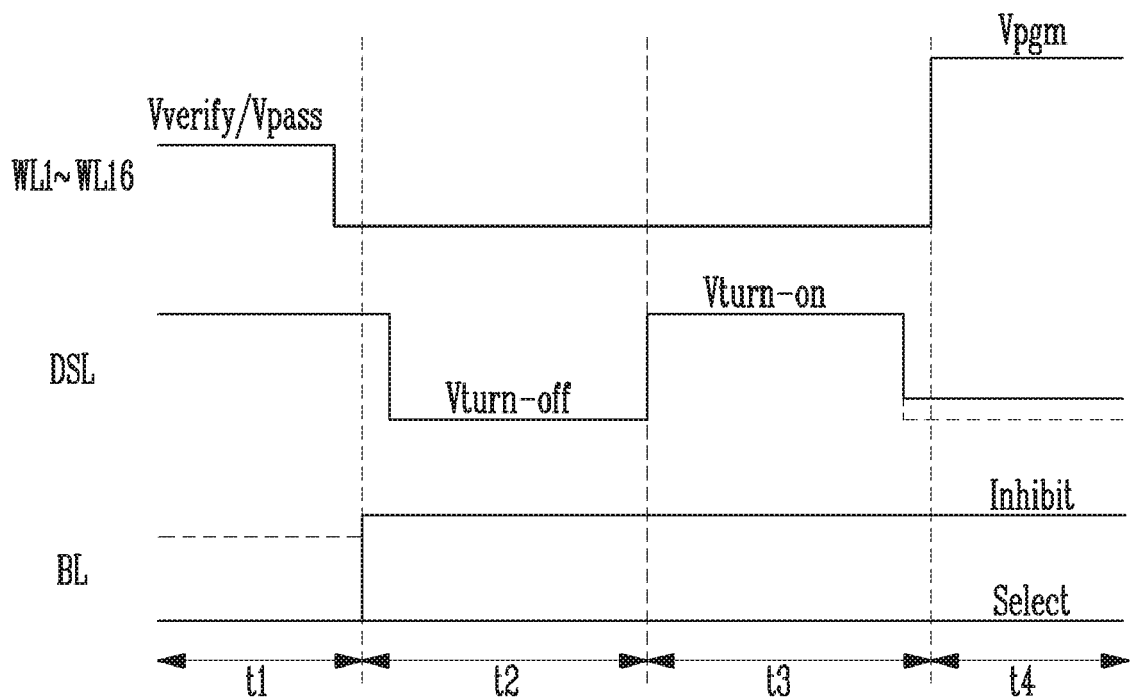
FIG. 11 is a waveform diagram of signals for illustrating a program operation of a memory device according to a second embodiment.

FIG. 11 is a waveform diagram of signals for illustrating the program operation of the memory device according to the second embodiment.

Referring to FIG. 11, the verify voltage Vverify and the pass voltage Vpass may be applied to the word lines WL1 to WL16 during the program verify operation (t1). After a predetermined time, the verify voltage Vverify and the pass voltage Vpass which are applied to the word lines WL1 to WL16 may be discharged. Thereafter, during the hole injection operation (t2), a bit line voltage having a positive potential may be applied to unselected bit lines Inhibit coupled to the unselected string in the program inhibit mode among the bit lines and a program allow voltage may be applied to selected bit lines Select coupled to the selected string to perform the program operation. The turn-off voltage Vturn-off may be applied to the drain select line DSL to generate GIDL at the channel under the drain select transistor. Thereafter, during the channel precharge operation (t3), the turn-on voltage Vturn-on may be applied to the drain select line DSL to precharge the channel of the unselected string in the program inhibit mode. Since the channel of the string is precharged by the hole injection operation (t2), the channel precharge operation (t3) may be skipped. Thereafter, during the program voltage apply operation (t4), the voltage applied to the drain select line DSL may be discharged to a ground voltage or a predetermined voltage level and the program voltage Vpgm and the pass voltage Vpass may be applied to the word lines WL1 to WL16.

Figure 12:
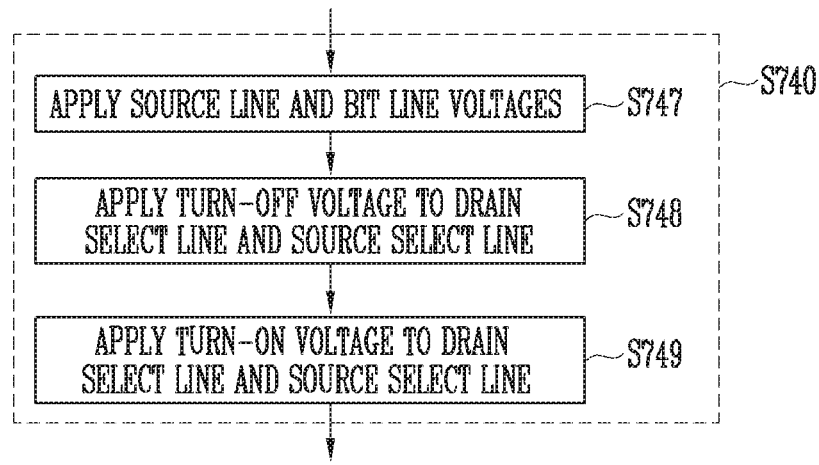
FIG. 12 is a flowchart illustrating a third embodiment of a hole injection operation shown in FIG. 7.

FIG. 12 is a flowchart illustrating a third embodiment of the hole injection operation (S740) shown in FIG. 7.

Referring to FIGS. 2, 3, and 12, during the hole injection operation (S740), the source line driver 270 may apply a source line voltage having a positive potential to the source line SL and the page buffer group 230 may apply a positive voltage to unselected bit lines coupled to the string in the program inhibit mode among the plurality of bit lines BL1 to BLm (S747). Thereafter, the voltage generating circuit 210 may generate and output a turn-off voltage, and the row decoder 220 may apply the turn-off voltage to the source select line SSL and the drain select line DSL (S748). Thereby, GIDL may be generated at the channel under the source select transistor SST and the channel under the drain select transistor DST and may flow towards a direction of the channel. In other words, hot holes may be generated at the channels under the source select transistor SST and the drain select transistor DST and may flow in towards the direction of the channel to increase the channel potential.

Thereafter, the voltage generating circuit 210 may generate and output a turn-on voltage, and the row decoder 220 may apply the turn-on voltage to the source select line SSL and the drain select line DSL (S749). Thereby, the channel potential of each of the strings in the program inhibit mode may be precharged by the bit line voltage and the channel potential of each of the strings in the program allow mode may be discharged by the program allow voltage applied to the bit line.

Although an embodiment in which the voltage generating circuit 210 generates the turn-off voltage and the row decoder 220 applies the turn-off voltage to the source select line SSL and the drain select line DSL at step S748 is described, the same effect may be obtained when the row decoder 220 couples the source select line SSL and the drain select line DSL to a ground power terminal to apply a turn-off voltage.

Figure 13:
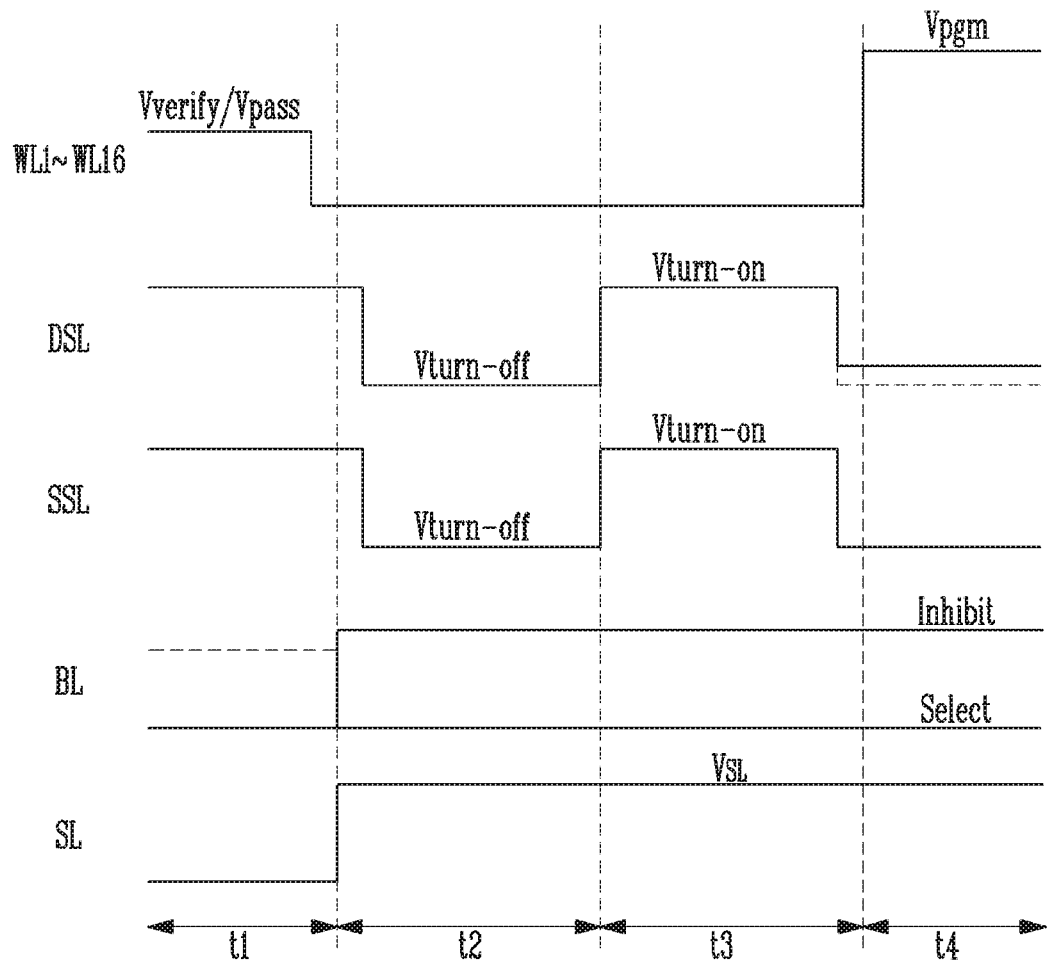
FIG. 13 is a waveform diagram of signals for illustrating a program operation of a memory device according to a third embodiment.

FIG. 13 is a waveform diagram of signals for illustrating a program operation of a memory device according to a third embodiment.

Referring to FIG. 13, the verify voltage Vverify and the pass voltage Vpass may be applied to the word lines WL1 to WL16 during the program verify operation (t1). After a predetermined time, the verify voltage Vverify and the pass voltage Vpass which are applied to the word lines WL1 to WL16 may be discharged. Thereafter, during the hole injection operation (t2), the positive source line voltage $V_{SL}$ may be applied to the source line SL, a bit line voltage having a positive potential may be applied to the unselected bit lines Inhibit coupled to the string in the program inhibit mode among the bit lines, and the program allow voltage may be applied to the selected bit lines Select coupled to the string to perform the program operation. The turn-off voltage Vturn-off may be applied to the source select line SSL and the drain select line DSL to generate GIDL at the channels under the source select transistor and the drain select transistor of the string in the program inhibit mode. Thereafter, during the channel precharge operation (t3), the turn-on voltage Vturn-on may be applied to the source select line SSL and the drain select line DSL to precharge the channel of the string in the program inhibit mode. Since the channel of the string is precharged by the hole injection operation (t2), the channel precharge operation (t3) may be skipped. Thereafter, during the program voltage apply operation (t4), the voltage applied to the source select line SSL and the drain select line DSL may be discharged to a ground voltage or a predetermined voltage and the program voltage Vpgm and the pass voltage Vpass may be applied to the word lines WL1 to WL16.

Figure 14:
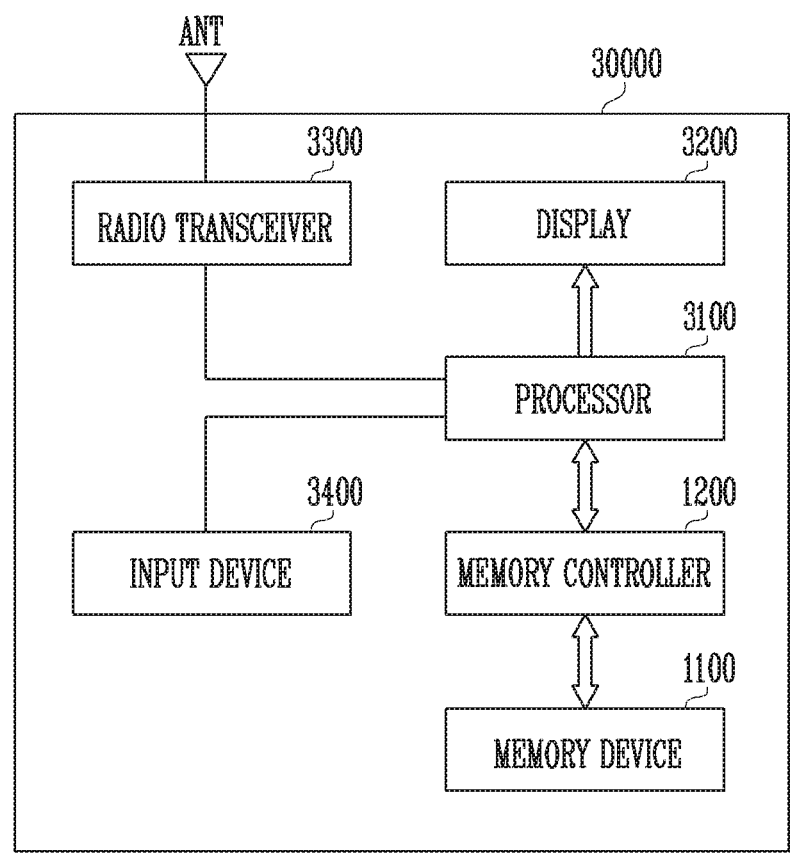
FIG. 14 is a diagram illustrating another embodiment of a memory system including the memory device shown in FIG. 2.

FIG. 14 is a diagram illustrating another embodiment of a memory system 30000 including the memory device 1100 shown in FIG. 2.

Referring to FIG. 14, the memory system 30000 may be embodied into a cellular phone, a smart phone, a tablet PC, a personal digital assistant (PDA), or a wireless communication device. The memory system 30000 may include the memory device 1100 and the memory controller 1200 controlling the operations of the memory device 1100. The memory controller 1200 may control a data access operation of the memory device 1100, for example, a program operation, an erase operation or a read operation in response to control of a processor 3100.

The memory controller 1200 may control data programmed into the memory device 1100 to be output through a display 3200.

A radio transceiver 3300 may exchange a radio signal through an antenna ANT. For example, the radio transceiver 3300 may change the radio signal received through the antenna ANT into a signal which can be processed by the processor 3100. Therefore, the processor 3100 may process the signal output from the radio transceiver 3300 and transfer the processed signal to the memory controller 1200 or the display 3200. The memory controller 1200 may program the signal processed by the processor 3100 into the memory device 1100. In addition, the radio transceiver 3300 may change the signal output from the processor 3100 into a radio signal, and output the radio signal to an external device through the antenna ANT. A control signal for controlling the operations of the processor 3100 or data to be processed by the processor 3100 may be input by an input device 3400, and the input device 3400 may include a pointing device, such as a touch pad and a computer mouse, a keypad, or a keyboard. The processor 3100 may control the operations of the display 3200 so that data output from the memory controller 1200, data output from the radio transceiver 3300, or data output from the input device 3400 may be output through the display 3200.

According to an embodiment, the memory controller 1200 controlling the operations of the memory device 1100 may form part of the processor 3100, or be formed as a separate chip from the processor 3100.

Figure 15:
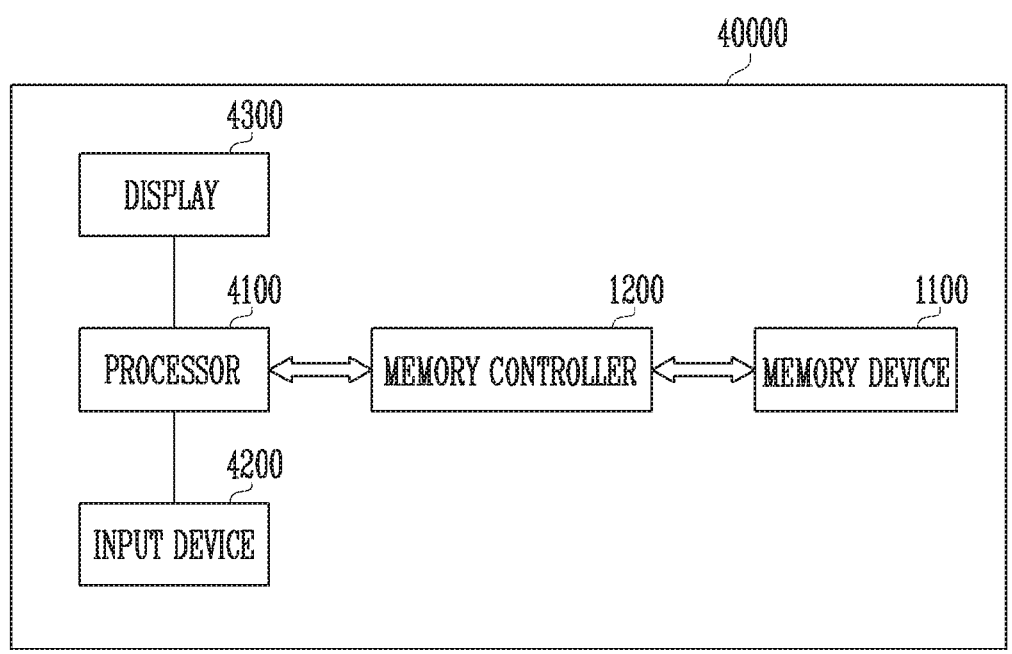
FIG. 15 is a diagram illustrating another embodiment of a memory system including the memory device shown in FIG. 2.

FIG. 15 is a diagram illustrating another embodiment of a memory system 40000 including the memory device 1100 shown in FIG. 2.

Referring to FIG. 15, the memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

A processor 4100 may output data stored in the memory device 1100 through a display 4300 according to data input through an input device 4200. Examples of the input device 4200 may include a pointing device such as a touch pad or a computer mouse, a keypad, or a keyboard.

The processor 4100 may control the general operations of the memory system 40000 and control the operations of the memory controller 1200. According to an embodiment, the memory controller 1200 controlling the operations of the memory device 1100 may be part of the processor 4100, or be formed as a separate chip from the processor 4100.

Figure 16:
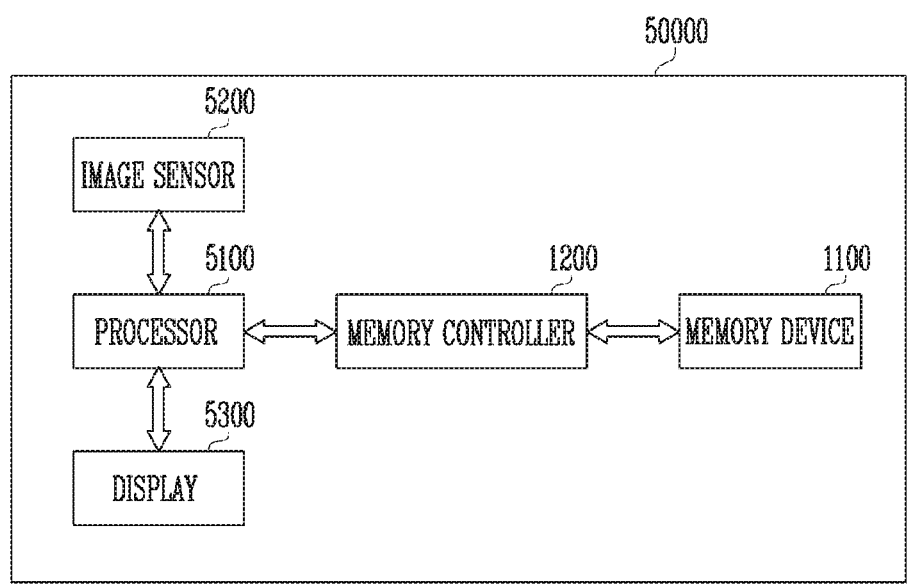
FIG. 16 is a diagram illustrating another embodiment of a memory system including the memory device shown in FIG. 2.

FIG. 16 is a diagram illustrating another embodiment of a memory system 50000 including the memory device 1100 shown in FIG. 2.

Referring to FIG. 16, the memory system 50000 may be provided as an image processing device, for example, a digital camera, a mobile phone attached with a digital camera, a smart phone attached with a digital camera, or a tablet PC attached with a digital camera.

The memory system 50000 may include the memory device 1100 and the memory controller 1200 controlling a data processing operation of the memory device 1100, for example, a program operation, an erase operation or a read operation.

An image sensor 5200 of the memory system 50000 may convert an optical image into digital signals, and the digital signals may be transferred to a processor 5100 or the memory controller 1200. In response to control of the processor 5100, the digital signals may be output through a display 5300 or stored in the memory device 1100 through the memory controller 1200. In addition, the data stored in the memory device 1100 may be output through the display 5300 according to control of the processor 5100 or the memory controller 1200.

According to an embodiment, the memory controller 1200 controlling the operations of the memory device 1100 may be part of the processor 5100, or be formed as a separate chip from the processor 5100.

Figure 17:
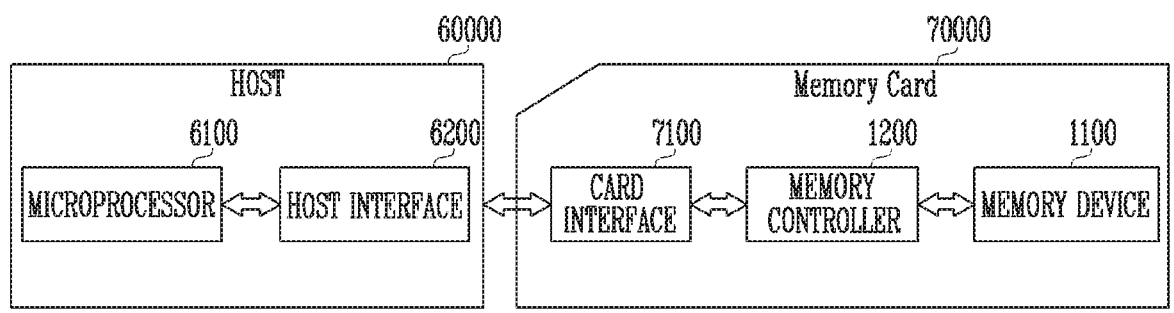
FIG. 17 is a diagram illustrating another embodiment of a memory system including the memory device shown in FIG. 2.

FIG. 17 is a diagram illustrating another embodiment of a memory system 70000 including the memory device 1100 shown in FIG. 2.

Referring to FIG. 17, the memory system 70000 may include a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be, but not limited to, a secure digital (SD) card interface or a multi-media card (MMC) interface.

The card interface 7100 may interface data exchange between a host 60000 and the memory controller 1200 according to a protocol of the host 60000. According to an embodiment, the card interface 7100 may support a Universal Serial Bus (USB) protocol, an Inter Chip (IC)-USB protocol. The card interface may refer to hardware capable of supporting a protocol which is used by the host 60000, software installed in the hardware, or a signal transmission method.

When the memory system 70000 is connected to an host interface 6200 of the host 60000 such as a PC, a tablet PC, a digital camera, a digital audio player, a cellular phone, a console video game hardware, or a digital set-top box, the host interface 6200 may perform data communication with the memory device 1100 through the card interface 7100 and the memory controller 1200 in response to control of a microprocessor 6100.

As described above, according to the present disclosure, a memory device may improve a program disturb phenomenon by increasing a channel potential level of an unselected string during a program operation.

In accordance with a present disclosure, the result of a final status check may be determined using the number of program pulses used in a program operation, and thus errors that may occur in overall operations after the program operation may be suppressed.

The above-described examples of embodiments are merely for the purpose of understanding the technical spirit of the present disclosure and the scope of the present disclosure should not be limited to the above-described examples of embodiments. It will be obvious to those skilled in the art to which the present disclosure pertains that other modifications based on the technical spirit of the present disclosure may be made in addition to the above-described examples of embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

What is claimed is:

1. A memory device, comprising:
a memory cell array including a plurality of memory blocks, wherein each of the plurality of memory blocks includes a plurality of strings;
a peripheral circuit coupled to the memory cell array and configured to sequentially perform a program voltage apply operation, a program verify operation, and a hole injection operation on the plurality of strings of a selected memory block among the plurality of memory blocks; and
a control logic configured to control an operation of the peripheral circuit,
wherein the control logic controls the operation of the peripheral circuit to perform the hole injection operation when a result of the program verify operation is determined as failed, so that the peripheral circuit generates Gate Induced Drain Leakage (GIDL) at a channel under a source select transistor of each of the plurality of strings of the selected memory block during the hole injection operation.

2. The memory device of claim 1, wherein the peripheral circuit comprises:
a voltage generating circuit configured to generate a program voltage, a verify voltage, a pass voltage, a turn-on voltage, and a turn-off voltage;
a row decoder configured to receive and apply the program voltage, the verify voltage, the pass voltage, the turn-on voltage, and the turn-off voltage to word lines, a source select line, and a drain select line of the memory cell array;
a source line driver coupled to a source line of the memory cell array and configured to apply a source line voltage to the source line; and
a page buffer group coupled to bit lines of the memory cell array, configured to control a potential level of each of the bit lines depending on data to be programmed during the program voltage apply operation, or configured to sense a potential level or an amount of current of each of the bit lines during the program verify operation.

3. The memory device of claim 2, wherein the source line driver applies a positive source line voltage to the source line and the row decoder applies the turn-off voltage to the source select line during the hole injection operation.

4. The memory device of claim 2, further comprising:
a row decoder control circuit configured for generating and outputting row decoder control signals for controlling the row decoder;
a source line driver control circuit configured for generating and outputting a source line control signal for controlling the source line driver;
a page buffer control circuit configured for generating and outputting page buffer control signals for controlling the page buffer group; and
a voltage generating control circuit configured for generating and outputting an operation signal for controlling the voltage generating circuit.

5. The memory device of claim 4, wherein the row decoder control circuit comprises:
a word line voltage control circuit configured for generating a first row decoder control signal for controlling the row decoder to selectively apply the program voltage, the verify voltage, and the pass voltage to the word lines of the memory cell array; and
a select line voltage control circuit configured for generating a second row decoder control signal for controlling the row decoder to selectively apply the turn-on voltage and the turn-off voltage to the source select line of the memory cell array.

6. The memory device of claim 1, wherein the peripheral circuit performs a channel precharge operation of precharging a channel of each of the strings to a level after the hole injection operation.

7. The memory device of claim 1, wherein the control logic controls the peripheral circuit to generate the GIDL at a channel under a drain select transistor of each string in a program inhibit mode from among the plurality of strings during the hole injection operation.

8. A memory device, comprising:
a memory cell array including a plurality of strings;
a peripheral circuit coupled to the memory cell array and configured for sequentially performing a program voltage apply operation, a program verify operation, and a hole injection operation; and
a control logic configured for controlling an operation of the peripheral circuit,
wherein the control logic controls the operation of the peripheral circuit to generate Gate Induced Drain Leakage (GIDL) at a channel under a drain select transistor of each unselected strings in a program inhibit mode from among the plurality of strings during the hole injection operation.

9. The memory device of claim 8, wherein the unselected strings in the program inhibit mode include a string including a memory cell determined as passed according to a result of the program verify operation and a string to which a program inhibit voltage is applied depending on data to be programmed.

10. The memory device of claim 8, wherein the peripheral circuit comprises:
a voltage generating circuit configured for generating a program voltage, a verify voltage, a pass voltage, a turn-on voltage, and a turn-off voltage;
a row decoder configured for receiving and applying the program voltage, the verify voltage, the pass voltage, the turn-on voltage, and the turn-off voltage to word lines, a source select line, and a drain select line of the memory cell array;
a source line driver coupled to a source line of the memory cell array and configured for applying a source line voltage to the source line; and
a page buffer group coupled to bit lines of the memory cell array, configured for controlling a potential level of each of the bit lines depending on data to be programmed during the program voltage apply operation, configured for sensing a potential level or an amount of current of each of the bit lines during the program verify operation, or configured for applying a positive voltage to bit lines coupled to the unselected strings in the program inhibit mode during the hole injection operation.

11. The memory device of claim 10, wherein the row decoder applies the turn-off voltage to the drain select line during the hole injection operation.

12. The memory device of claim 10, further comprising:
a row decoder control circuit configured for generating and outputting row decoder control signals for controlling the row decoder;
a source line driver control circuit configured for generating and outputting a source line control signal for controlling the source line driver;

a page buffer control circuit configured for generating and outputting page buffer control signals for controlling the page buffer group; and a voltage generating control circuit configured for generating and outputting an operation signal for controlling the voltage generating circuit.

13. The memory device of claim 12, wherein the row decoder control circuit comprises:

a word line voltage control circuit configured for generating a first row decoder control signal for controlling the row decoder to selectively apply the program voltage, the verify voltage, and the pass voltage to the word lines of the memory cell array; and a select line voltage control circuit configured for generating a second row decoder control signal for controlling the row decoder to selectively apply the turn-on voltage and the turn-off voltage to the drain select line of the memory cell array.

14. The memory device of claim 8, wherein the peripheral circuit performs a channel precharge operation of precharging a channel of each of the strings to a level after the hole injection operation.

15. The memory device of claim 8, wherein the control logic controls the peripheral circuit to generate the GIDL at a channel under a source select transistor of each of the plurality of strings during the hole injection operation.

16. A method of performing a program operation of a memory device including a plurality of strings, the method comprising:

applying a program voltage to a selected word line among word lines of the plurality of strings;

performing a program verify operation;

performing a hole injection operation to generate Gate Induced Drain Leakage (GIDL) at a channel under a source select transistor of each of the plurality of strings when a result of the program verify operation is determined as failed; and reperforming the program operation from the applying of the program voltage by increasing the program voltage.

17. The method of claim 16, further comprising:

applying a positive source line voltage to a source line coupled to the plurality of strings during the hole injection operation; and applying a turn-off voltage to a source select line coupled to the source select transistor of each of the plurality of strings.

18. The method of claim 16, further comprising precharging a channel of each of the plurality of strings before reperforming the applying of the program voltage after performing the hole injection operation.

19. The method of claim 16, wherein the hole injection operation generates the GIDL at a channel under a drain select transistor of each of unselected strings in a program inhibit mode among the plurality of strings.

20. The method of claim 19, further comprising:

applying a positive voltage to the unselected strings in the program inhibit mode and a bit line during the hole injection operation; and applying a turn-off voltage to a drain select line coupled to the drain select transistor of each of the plurality of strings.

21. A method of performing a program operation of a memory device including a plurality of strings, the method comprising:

applying a program voltage to a selected word line among word lines of the plurality of strings;

performing a program verify operation;

performing a hole injection operation to generate Gate Induced Drain Leakage (GIDL) at a channel under a drain select transistor of each of unselected strings in a program inhibit mode among the plurality of strings when a result of the program verify operation is determined as failed; and reperforming the program operation from the applying of the program voltage by increasing the program voltage.

22. The method of claim 21, further comprising:

applying a positive voltage to the unselected strings in the program inhibit mode and to a bit line of the unselected strings during the hole injection operation; and applying a turn-off voltage to a drain select line coupled to the drain select transistor of each of the plurality of strings.

23. The method of claim 21, further comprising precharging a channel of each of the plurality of strings before reperforming the applying of the program voltage after performing the hole injection operation.

24. The method of claim 21, wherein the hole injection operation generates the GIDL at a channel under a source select transistor of each of the plurality of strings.

25. The method of claim 24, further comprising:

applying a positive source line voltage to a source line coupled to the plurality of strings during the hole injection operation; and applying a turn-off voltage to a source select line coupled to the source select transistor of each of the plurality of strings.

26. A memory device, comprising:

a memory cell array including a plurality of strings; and a peripheral circuit coupled to the memory cell array and configured to perform a program operation on a selected string from the plurality of strings and a hole injection operation on an unselected string from the plurality of strings, wherein the peripheral circuit applies a positive voltage to the unselected string in a program inhibit mode and to a bit line of the unselected string during the hole injection operation, and wherein the peripheral circuit applies a turn-off voltage to a drain select line coupled to a drain select transistor of each of the plurality of strings.

* * * * *